(12) United States Patent
Liu et al.

(10) Patent No.: US 7,973,393 B2
(45) Date of Patent: Jul. 5, 2011

(54) STACKED MICRO OPTOCOUPLERS AND METHODS OF MAKING THE SAME

(75) Inventors: Yong Liu, Scarborough, ME (US); Yumin Liu, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 83 days.

(21) Appl. No.: 12/365,793

(22) Filed: Feb. 4, 2009

(65) Prior Publication Data
US 2010/0193803 A1   Aug. 5, 2010

(51) Int. Cl.
*H01L 39/00*   (2006.01)
(52) U.S. Cl. .......... 257/661; 257/81; 257/621; 257/672; 257/676; 257/692; 257/E21.705
(58) Field of Classification Search ............ 257/81, 257/621, 661, 672, 676, 692, E21.705
See application file for complete search history.

(56) References Cited

U.S. PATENT DOCUMENTS

| | | |
|---|---|---|
| 3,956,821 A | 5/1976 | Martin |
| 4,058,899 A | 11/1977 | Phy |
| 4,114,177 A | 9/1978 | King |
| 4,124,860 A | 11/1978 | Johnson |
| 4,191,943 A | 3/1980 | Cairns et al. |
| 4,445,043 A | 4/1984 | Hill |
| 4,450,461 A | 5/1984 | Cook et al. |
| 4,680,613 A | 7/1987 | Daniels et al. |
| 4,712,017 A | 12/1987 | Kamasaki |
| 4,720,396 A | 1/1988 | Wood |
| 4,731,701 A | 3/1988 | Kuo et al. |
| 4,751,199 A | 6/1988 | Phy |
| 4,769,709 A | 9/1988 | Van De Steeg |
| 4,772,935 A | 9/1988 | Lawler et al. |
| 4,791,473 A | 12/1988 | Phy |
| 4,794,431 A | 12/1988 | Park |
| 4,796,080 A | 1/1989 | Phy |
| 4,839,717 A | 6/1989 | Phy et al. |
| 4,857,746 A | 8/1989 | Kuhlmann et al. |
| 4,890,153 A | 12/1989 | Wu |
| 4,954,853 A | 9/1990 | Yoshida et al. |
| 5,172,214 A | 12/1992 | Casto |
| 5,203,075 A | 4/1993 | Angulas et al. |
| 5,299,727 A | 4/1994 | Kofler |
| 5,327,325 A | 7/1994 | Nicewarner, Jr. |
| 5,327,443 A | 7/1994 | Tanaka et al. |
| 5,450,283 A | 9/1995 | Lin et al. |
| 5,537,075 A | 7/1996 | Miyazaki |

(Continued)

FOREIGN PATENT DOCUMENTS

JP         06-021506 A      1/1994

*Primary Examiner* — Tan N Tran
(74) *Attorney, Agent, or Firm* — Kilpatrick Townsend & Stockton LLP

(57) ABSTRACT

Disclosed are packages for optocouplers and methods of making the same. An exemplary optocoupler comprises a substrate having a first surface and a second surface, a plurality of optoelectronic dice for one or more optocouplers disposed on the substrate's first surface, and a plurality of optoelectronic dice for one or more optocouplers disposed on the substrate's second surface. The substrate may comprise a pre-molded leadframe, and electrical connections between optoelectronic dice on opposite surfaces of the substrate may be made via one or more leads of the leadframe.

27 Claims, 11 Drawing Sheets

U.S. PATENT DOCUMENTS

| | | | |
|---|---|---|---|
| 5,545,893 A | 8/1996 | Brown et al. |
| 5,637,916 A | 6/1997 | Joshi |
| 5,646,446 A | 7/1997 | Nicewarner, Jr. et al. |
| 5,677,245 A | 10/1997 | Brown et al. |
| 5,729,437 A | 3/1998 | Hashimoto |
| 5,765,280 A | 6/1998 | Joshi |
| 5,776,797 A | 7/1998 | Nicewarner, Jr. et al. |
| 5,777,386 A | 7/1998 | Higashi et al. |
| 5,789,809 A | 8/1998 | Joshi |
| 6,133,634 A | 10/2000 | Joshi |
| 6,143,981 A | 11/2000 | Glenn |
| 6,229,200 B1 | 5/2001 | Mclellan et al. |
| 6,242,281 B1 | 6/2001 | Mclellan et al. |
| 6,294,403 B1 | 9/2001 | Joshi |
| 6,424,035 B1 | 9/2001 | Sapp et al. |
| 6,307,272 B1 | 10/2001 | Takahashi et al. |
| 6,324,072 B1 | 11/2001 | Lorenz et al. |
| 6,329,706 B1 | 12/2001 | Nam |
| 6,342,670 B1 | 1/2002 | Lin et al. |
| 6,384,472 B1 | 5/2002 | Huang |
| 6,393,183 B1 | 5/2002 | Worley |
| 6,432,750 B2 | 8/2002 | Jeon et al. |
| 6,433,277 B1 | 8/2002 | Glenn |
| 6,437,429 B1 | 8/2002 | Su et al. |
| 6,449,174 B1 | 9/2002 | Elbanhawy |
| 6,469,384 B2 | 10/2002 | Joshi |
| 6,476,495 B2 | 11/2002 | Konishi |
| 6,479,888 B1 | 11/2002 | Hirashima et al. |
| 6,489,678 B1 | 12/2002 | Joshi |
| 6,518,653 B1 | 2/2003 | Takagi |
| 6,528,869 B1 | 3/2003 | Joshi |
| 6,556,750 B2 | 4/2003 | Constantino et al. |
| 6,564,100 B2 | 5/2003 | Joshi |
| 6,566,749 B1 | 5/2003 | Joshi et al. |
| 6,573,487 B2 | 6/2003 | Matsumoto |
| 6,574,107 B2 | 6/2003 | Jeon et al. |
| 6,603,183 B1 | 8/2003 | Hoffman |
| 6,621,152 B2 | 9/2003 | Choi et al. |
| 6,627,991 B1 | 9/2003 | Joshi |
| 6,633,030 B2 | 10/2003 | Joshi |
| 6,642,738 B2 | 11/2003 | Elbanhawy |
| 6,645,791 B2 | 11/2003 | Noquil et al. |
| 6,661,082 B1 | 12/2003 | Granada et al. |
| 6,674,157 B2 | 1/2004 | Lang |
| 6,683,375 B2 | 1/2004 | Joshi et al. |
| 6,696,321 B2 | 2/2004 | Joshi |
| 6,700,793 B2 | 3/2004 | Takagawa et al. |
| 6,720,642 B1 | 4/2004 | Joshi et al. |
| 6,731,002 B2 | 5/2004 | Choi |
| 6,731,003 B2 | 5/2004 | Joshi et al. |
| 6,740,541 B2 | 5/2004 | Rajeev |
| 6,753,605 B2 | 6/2004 | Joshi |
| 6,756,689 B2 | 6/2004 | Nam et al. |
| 6,774,465 B2 | 8/2004 | Lee et al. |
| 6,777,800 B2 | 8/2004 | Madrid et al. |
| 6,784,376 B1 | 8/2004 | Huemoeller et al. |
| 6,798,044 B2 | 9/2004 | Joshi |
| 6,798,047 B1 | 9/2004 | Miks et al. |
| 6,806,580 B2 | 10/2004 | Joshi et al. |
| 6,818,973 B1 | 11/2004 | Foster |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,949,410 B2 | 9/2005 | Joshi et al. |
| 6,953,998 B2 | 10/2005 | Joshi |
| 6,989,588 B2 | 1/2006 | Quinones et al. |
| 6,990,262 B2 | 1/2006 | Sato |
| 6,992,384 B2 | 1/2006 | Joshi |
| 7,008,868 B2 | 3/2006 | Joshi |
| 7,022,548 B2 | 4/2006 | Joshi et al. |
| 7,023,077 B2 | 4/2006 | Madrid |
| 7,029,947 B2 | 4/2006 | Joshi |
| 7,061,077 B2 | 6/2006 | Joshi |
| 7,061,080 B2 | 6/2006 | Jeun et al. |
| 7,066,660 B2 | 6/2006 | Ellison |
| 7,081,666 B2 | 7/2006 | Joshi et al. |
| 7,101,734 B2 | 9/2006 | Granada et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,195,955 B2 | 3/2007 | Nguyen et al. |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,358,958 B2 | 11/2008 | Welch et al. |
| 7,589,338 B2 | 9/2009 | Liu et al. |
| 7,768,123 B2 | 8/2010 | Liu et al. |
| 2004/0173894 A1 | 9/2004 | Glenn et al. |
| 2004/0190274 A1 | 9/2004 | Saito et al. |
| 2005/0047731 A1 | 3/2005 | Hu et al. |
| 2006/0284124 A1* | 12/2006 | Aki ............................ 250/551 |
| 2007/0063125 A1 | 3/2007 | Downing, Jr. |
| 2007/0187629 A1 | 8/2007 | Matsuyama |
| 2008/0087900 A1 | 4/2008 | Yang |
| 2009/0057852 A1 | 3/2009 | Madrid |
| 2009/0140266 A1 | 6/2009 | Liu et al. |
| 2009/0173953 A1 | 7/2009 | Liu et al. |
| 2009/0174047 A1 | 7/2009 | Irving et al. |
| 2009/0174048 A1 | 7/2009 | Liu et al. |
| 2009/0194857 A1 | 8/2009 | Liu et al. |

* cited by examiner

STACKED MICRO OPTOCOUPLERS AND METHODS OF MAKING THE SAME

CROSS-REFERENCES TO RELATED APPLICATIONS

None.

BACKGROUND OF THE INVENTION

An optocoupler contains an optical emitter device that is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an electrically insulating gap, the transfer is one way. For example, the optical receiver device cannot modify the operation of a circuit containing the optical emitter device. This feature is desirable because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit, and allows the two circuits to be at different ground potentials.

BRIEF SUMMARY OF THE INVENTION

As part of making their invention, the inventors have recognized that optocouplers are being used in greater numbers in power conversion circuits, and that the relatively bulky size of multiple optocouplers in a power conversion circuit will be an impediment to allowing the size and volume of the circuit to be reduced. Also as part of making their invention, the inventors have recognized that there is a need to reduce the costs of optocouplers and to increase their electrical performance. Aspects of the present invention provide two or more optocouplers on separate sides of a substrate to enable a package size that is smaller than the combined package size of individually packaged optocouplers. Further aspects of the present invention reduce manufacturing costs and improve electrical performance.

Accordingly, a first general exemplary embodiment according to a first invention of the present application is directed to an optocoupler package comprising: a substrate comprising a first surface, a second surface, and a plurality of conductive regions disposed at the first and second surfaces; a first optoelectronic die disposed on the substrate's first surface; a second optoelectronic die disposed on the substrate's first surface and optically coupled to the first optoelectronic die; a third optoelectronic die disposed on the substrate's second surface; and a fourth optoelectronic die disposed on the substrate's second surface and optically coupled to the third optoelectronic die. Bodies of optically transmissive material may be disposed on and between the dice on each side of the substrate, and molding material may be disposed over the bodies of optically transmissive material. In further embodiments, terminals to the dice may be provided as leads that extend from the substrate or as interconnect pads disposed on the substrate to interface with interconnect bumps and the like. Further embodiments may include additional dice for additional optocouplers. Connections between the dice and the terminals may comprise wire-bonds or other interconnect structures.

With this exemplary construction, two or more optocouplers may be placed on separate sides of a substrate to enable a package size that is smaller than the combined package size of individually packaged optocouplers. The reduced volume enables the electrical interconnect structures to be shorted for improved electrical performance. The arrangement of the dice on a substrate simplifies the processes of disposing the bodies of optically transmissive material, thereby reducing manufacturing time and cost.

A second general exemplary embodiment according to a first invention of the present application is directed to a method of making a package comprising: assembling a first optoelectronic die and a second optoelectronic die on a first surface of a substrate, the second optoelectronic die being optically coupled to the first optoelectronic die; and assembling a third optoelectronic die and a fourth optoelectronic die on a second surface of the substrate, the fourth optoelectronic die being optically coupled to the third optoelectronic die. Further embodiments may include disposing bodies of optically transmissive material over and between pairs of optoelectronic dice, and disposing molding material over the bodies.

With aspects of the above exemplary method, the bodies of optically transmissive material may be disposed on two or more optocouplers in a simplified manner that does not require the use of temporary paper and ribbon supports to form the bodies of light transmissive material.

The above exemplary embodiments and other embodiments of the inventions are described in the Detailed Description with reference to the Figures. In the Figures, like numerals may reference like elements and descriptions of some elements may not be repeated.

DETAILED DESCRIPTION OF THE INVENTION

Figure 1:
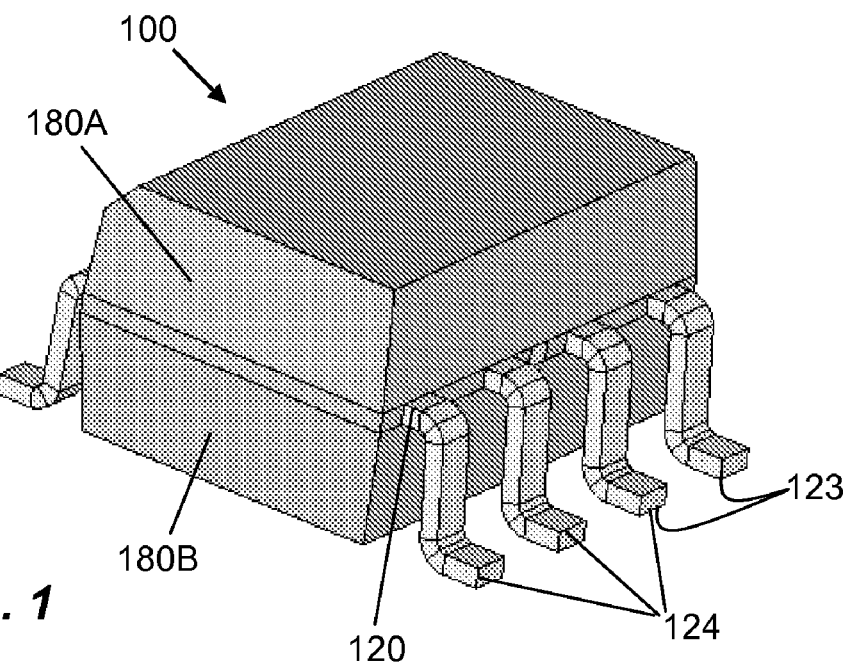
FIG. 1 shows a perspective view of an exemplary semiconductor die package that incorporates multiple optocouplers according to the present invention.

The present invention will be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure is thorough and complete and fully conveys the scope of the invention to one skilled in the art. In the drawings, the thicknesses of layers and regions may be exaggerated for clarity. The same reference numerals are used to denote the same elements throughout the specification. The elements may have different interrelationships and different positions for different embodiments.

It will also be understood that when a layer is referred to as being "on" another layer or substrate, it can be directly on the other layer or substrate, or intervening layers may also be present. It will also be understood that when an element, such as a layer, a region, or a substrate, is referred to as being "on," "connected to," "electrically connected to," "coupled to," or "electrically coupled to" another element, it may be directly on, connected or coupled to the other element, or one or more intervening elements may be present. In contrast, when an element is referred to as being "directly on," "directly connected to" or "directly coupled to" another element or layer, there are no intervening elements or layers present. The term "and/or" used herein includes any and all combinations of one or more of the associated listed items.

The terms used herein are for illustrative purposes of the present invention only and should not be construed to limit the meaning or the scope of the present invention. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. Spatially relative terms, such as "over," "above," "upper," "under," "beneath," "below," "lower," and the like, may be used herein for ease of description to describe one element or feature's relationship to another element(s) or feature(s) as illustrated in the figures. It will be understood that the spatially relative terms are intended to encompass different orientations of the device (e.g., optocoupler, package) in use or operation in addition to the orientation depicted in the figures. For example, if the device in the figures is turned over, elements described as "below" or "beneath" or "under" other elements or features would then be oriented "over" or "above" the other elements or features. Thus, the exemplary term "above" may encompass both an above and below orientation.

As used herein, terms such as "first," "second," etc. are used to describe various members, components, regions, layers, and/or portions. However, it is obvious that the members, components, regions, layers, and/or portions should not be defined by these terms. The terms are used only for distinguishing one member, component, region, layer, or portion from another member, component, region, layer, or portion. Thus, a first member, component, region, layer, or portion which will be described may also refer to a second member, component, region, layer, or portion, without departing from the scope of the present invention.

FIG. 1 shows a first exemplary embodiment 100 of an optoelectronic package according to the present invention. Package 100 comprises a center substrate 110 (shown in FIG. 3) for holding a plurality of components, a first body 180A of molding material disposed over the top surface of substrate 110 and encapsulating components disposed at the substrate's top surface, and a second body 180B of molding material disposed under the bottom surface of substrate 110 and encapsulating components disposed at the substrate's bottom surface. Substrate 110 may comprise a leadframe 120 having a plurality of leads 124 extending from the leadframe's central portion, and a body 115 (shown in FIG. 3) of electrically insulating material disposed in the central portion of the leadframe and between leads 124. Eight leads 124 are shown. The central portion (e.g., body 115) of substrate 110 is encased by the first and second bodies 180A-180B of molding material, and the leads 124 have distal portions that extend away from bodies 180A-180B. Each lead 124 is bent at two locations in an "S" shape, and has a foot 123 that is coplanar with the bottom surface of second body 180B to within a millimeter. Bodies 180A and 180B of molding material are electrically insulating and may comprise an epoxy molding compound (EMC) and the like. In other implementations, substrate 110 may comprise a printed circuit board, a flex circuit substrate, a ceramic substrate, or the like.

Figure 2:
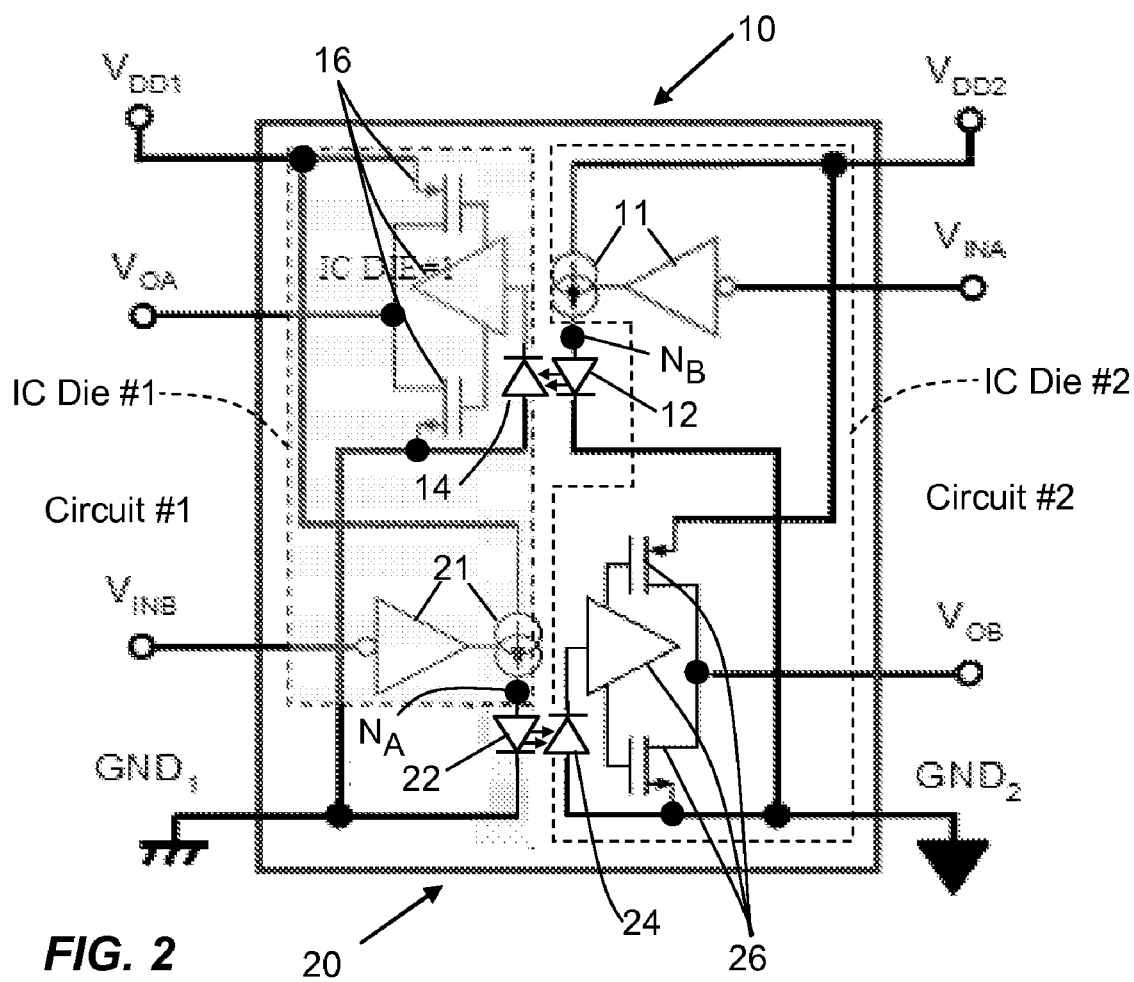
FIG. 2 shows a schematic diagram of exemplary circuitry for multiple optocouplers that may be housed by an exemplary semiconductor die package that incorporates multiple optocouplers according to the present invention.

Package 100 houses two optoelectronic couplers ("optocouplers") that are constructed to optically convey two electrical signals between two electrically isolated electrical circuits so that the two electrical circuits may operate from different sets of power and ground potentials. One of the two electrical circuits may be denoted as Circuit #1 having supply voltage $VDD_1$ and ground potential $GND_1$, and the other may be denoted as Circuit #2 having supply voltage $VDD_2$ and ground potential $GND_2$. FIG. 2 shows a schematic diagram of exemplary circuitry for multiple optocouplers that may be housed by package 100, with its eight terminal connections, and with the two electrical circuits being designated as "Circuit #1" and "Circuit #2." The left side of the package circuitry is fed by the supply voltage $VDD_1$ and ground potential $GND_1$ of Circuit #1, and the right side is fed by the supply voltage $VDD_2$ and ground potential $GND_2$ of Circuit #2. An electrical signal $V_{INA}$ from Circuit #2 is conveyed to Circuit #1 as electrical signal $V_{OA}$, and an electrical signal $V_{INB}$ from Circuit #1 is conveyed to Circuit #2 as electrical signal $V_{OB}$.

A first driver 11 receives the first electrical signal $V_{INA}$ and generates a drive signal that is coupled to a first light-emitting device 12. The output light intensity of first light-emitting device 12 varies in relation to the value of electrical signal $V_{INA}$. Light from device 12 is optically coupled to a first light-receiving device 14, which may comprise a photodiode. First light-receiving device 14 has an electrical output that is coupled to a first amplifier 16. First light-receiving device 14 and amplifier 16 generate electrical signal $V_{OA}$ in relation to the intensity of the received light, and thus in relation to signal $V_{INA}$. Components 11 and 12 are powered by $VDD_2$ and $GND_2$ of Circuit #2, and components 14 and 16 are powered by $VDD_1$ and $GND_1$ of Circuit #1. Components 11-16 collectively comprise a first optocoupler 10. In a similar manner, a second driver 21 receives the second electrical signal $V_{INB}$ and generates a drive signal that is coupled to a second light-emitting device 22. The output light intensity of second light-emitting device 22 varies in relation to the value of electrical signal $V_{INB}$. Light from device 22 is optically coupled to a second light-receiving device 24, which may comprise a photodiode. Second light-receiving device 24 has an electrical output that is coupled to a second amplifier 26. Second light-receiving device 24 and amplifier 26 generate electrical signal $V_{OB}$ in relation to the intensity of the received light, and thus in relation to signal $V_{INB}$. Components 21 and 22 are powered by $VDD_1$ and $GND_1$ of Circuit #1, and components 24 and 26 are powered by $VDD_2$ and $GND_2$ of Circuit #2. Components 21-26 collectively comprise a second optocoupler 20.

In typical embodiments, the light-emitting device 22 is disposed on an individual die, and driver 21 of optocoupler 20 and the light-receiving device 14 and amplifier 16 of optocoupler 10 are integrated together on another semiconductor die (IC Die #1 in the figure). The two die share an electrical interconnection that is denoted as node $N_A$ in the figure. Similarly, the light-emitting device 12 is disposed on an individual die, and driver 11 of optocoupler 10 and the light-receiving device 24 and amplifier 26 of optocoupler 20 are integrated together on another semiconductor die (IC Die #2 in the figure). The two die share an electrical interconnection that is denoted as node $N_B$ in the figure.

Figure 3:
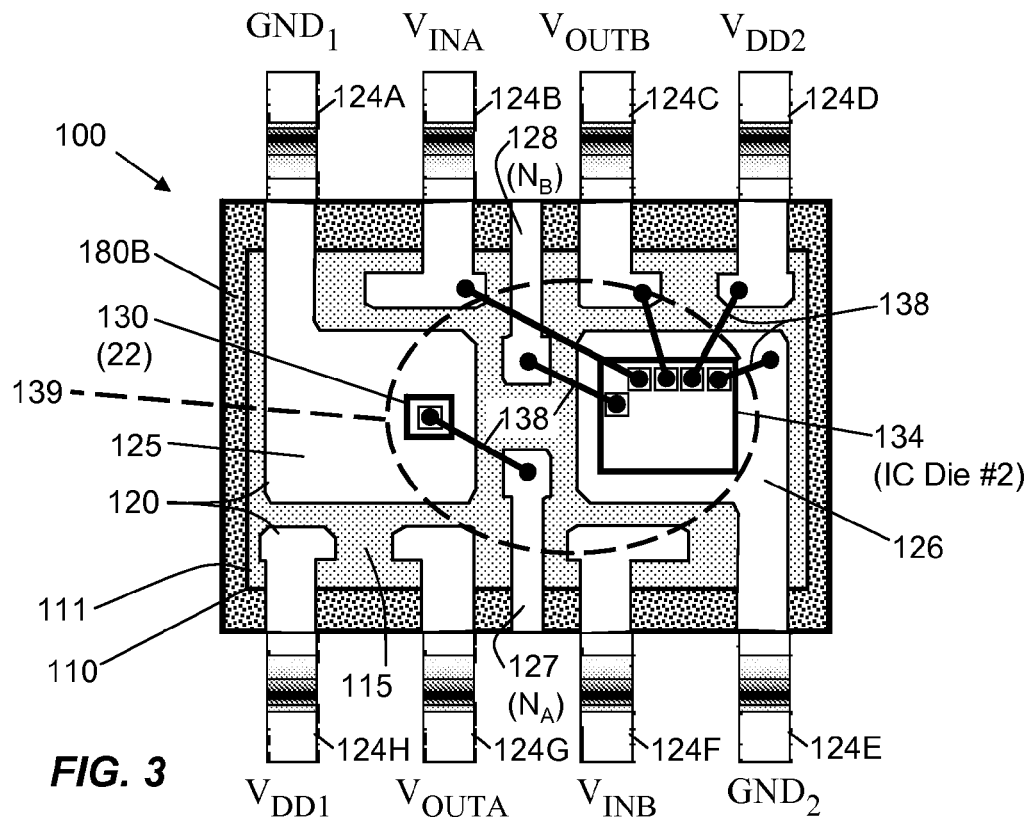
FIGS. 3 and 4 show top and bottom plan views, respectively, of the exemplary semiconductor die package shown in FIG. 1, with molding material removed to show housed components, according to the present invention.

FIG. 3 shows a top plan view of package 100 with molding body 180A removed to show the components mounted on a top surface 111 of substrate 110. The leads 124 of leadframe 120 are identified as leads 124A-124H in the figure, and the corresponding circuit voltages and signals of FIG. 2 are shown at the distal ends of the leads. As shown in the figure, leadframe 120 further comprises a first die attach region 125 electrically and physically coupled to lead 124A (and voltage $GND_1$), and a second die attach region 126 electrically and physically coupled to lead 124E (and voltage $GND_2$). Body 115 of electrically insulating material is disposed between leads 124 and die attach regions 125 and 126, with molding bodies 180A and 180B surrounding body 115. Body 115 may comprise an epoxy (such as an epoxy molding compound), a silicone, and/or a polyimide (i.e., it may comprise one or more of these materials).

A light-emitting die 130 houses second light-emitting device 22 of second optocoupler 20 (shown in FIG. 2), and is disposed on first die attach region 125 at the top surface 111 of substrate 110. Light-emitting die 130 may have a backside electrode that is electrically coupled to first die attach region 125 by a conductive adhesive, such as solder, and a topside electrode that is electrically coupled to a first internal lead 127 of leadframe 120 by a wirebond 138. The top electrode is shown as a small square in the center of die 130. First internal lead 127 provides node $N_A$ of second optocoupler 20 shown in FIG. 2. As described below in greater detail, internal lead 127 is electrically coupled to a driver 21 on a die that is disposed on a bottom surface 112 of substrate 110. Instead of a backside electrode electrically coupled to die attach region 125, light-emitting die 130 may comprise a second topside electrode that is electrically coupled to region 125 by a wirebond.

A light-receiving die 134 is disposed on second die attach region 126 at the top surface 111 of substrate 110; it houses second light-receiving device 24 and second amplifier 26 of second optocoupler 20 (shown in FIG. 2), as well as first driver 11 of first optocoupler 10 (shown in FIG. 2). Light-receiving die 134 may have a backside electrode that is electrically coupled to second die attach region 126 by a conductive adhesive, such as solder, and has a plurality of topside electrodes that are electrically coupled to leads 124B-124D, die region 126, and a second internal lead 128 of leadframe 120 by respective wirebonds 138, as shown in the figure. The top electrodes are shown as respective small squares on the top surface of die 134. The aforementioned wirebonds interconnect second light-receiving device 24 to ground $GND_2$, interconnect second amplifier 26 to supply voltage $VDD_2$, ground $GND_2$, and signal $V_{OUTB}$, and interconnect first driver 11 to input signal $V_{INA}$, supply voltage $VDD_2$ ground $GND_2$, and second internal lead 128. As described below, first light-emitting device 11 is housed by a die disposed on the opposite side of substrate 110, and is electrically coupled to second internal lead 128, and thus to first driver 11. Second light-receiving device 24 and light-receiving die 134 receive light from second light-emitting device 22 and light-emitting die 130. The coupling of the light from die 130 to 134 may be enhanced by a body 139 of a light transmissive material that is disposed over the dice, as shown by the dashed outline in the figure. A layer of reflective or partially reflective material may be disposed over the top of body 139 to further enhance the coupling of light.

Figure 4:
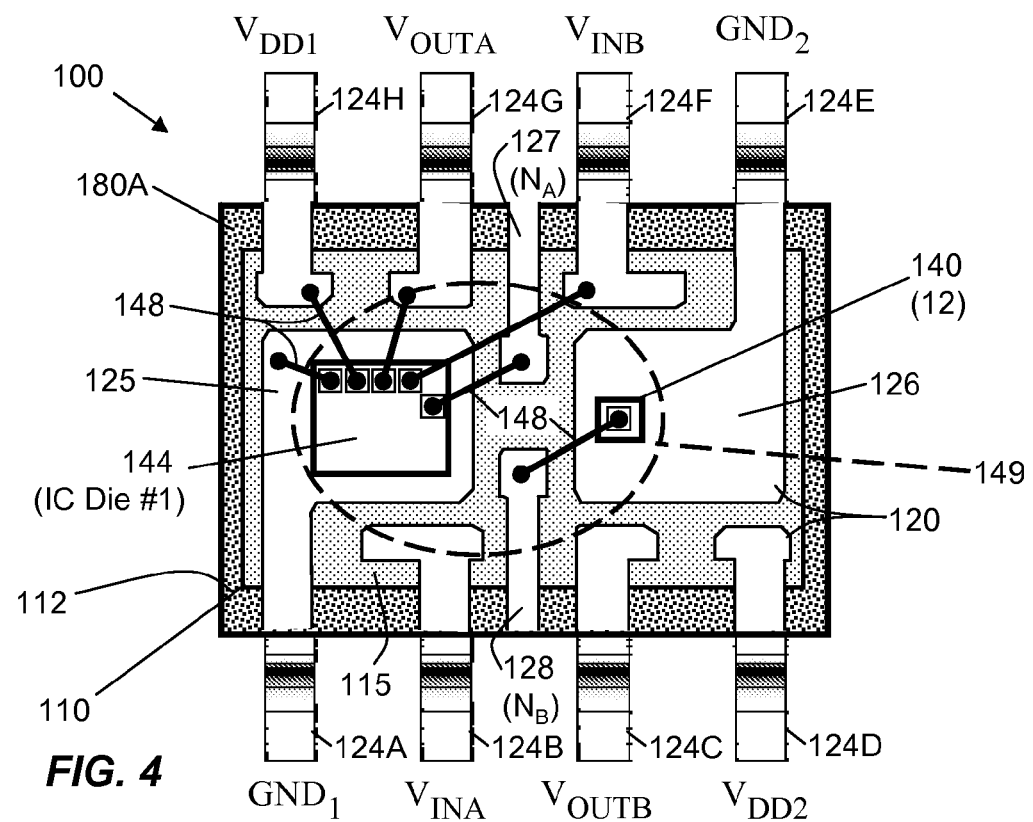

FIG. 4 shows a bottom plan view of package 100 with molding body 180B removed to show the components mounted on a bottom surface 112 of substrate 110. The corresponding circuit voltages and signals of FIG. 2 for the leads 124A-124H are shown at the distal ends of the leads, and the bottom surfaces of die attach regions 125 and 126 can be seen. Another light-emitting die 140 houses first light-emitting device 12 of first optocoupler 10 (shown in FIG. 2), and is disposed on second die attach region 126 at the bottom surface 112 of substrate 110. Light-emitting die 140 may have a backside electrode that is electrically coupled to second die attach region 126 by a conductive adhesive, such as solder, and a topside electrode that is electrically coupled to second internal lead 128 of leadframe 120 by a wirebond 148. The top electrode is shown as a small square in the center of die 140. Second internal lead 128 provides node $N_B$ of second optocoupler 20 shown in FIG. 2. As previously described above, internal lead 128 is electrically coupled to first driver 11 on die 134 that is disposed on the top surface 111 of substrate 110; thus first light-emitting device 12 is electrically coupled to driver 11 on the opposite side of substrate 110. Instead of a backside electrode electrically coupled to die attach region 126, light-emitting die 140 may comprise a second topside electrode that is electrically coupled to region 126 by a wirebond.

Another light-receiving die 144 is disposed on first die attach region 125 at the bottom surface 112 of substrate 110; it houses first light-receiving device 14 and first amplifier 16 of first optocoupler 10 (shown in FIG. 2), as well as second driver 21 of second optocoupler 20 (shown in FIG. 2). Light-receiving die 144 may have a backside electrode that is electrically coupled to first die attach region 125 by a conductive adhesive, such as solder, and has a plurality of topside electrodes that are electrically coupled to die region 125, leads 124F-124H, and first internal lead 127 of leadframe 120 by respective wirebonds 148, as shown in the figure. The top electrodes are shown as respective small squares on the top surface of die 144. The aforementioned wirebonds interconnect first light-receiving device 14 to ground $GND_1$, interconnect first amplifier 16 to supply voltage $VDD_1$, ground $GND_1$, and signal $V_{OUTA}$, and interconnect second driver 21 to input signal $V_{INB}$, supply voltage $VDD_1$ ground $GND_1$, and first internal lead 127. As described above, second light-emitting device 22 is housed by die 130 disposed on the opposite side of substrate 110, and is electrically coupled to first internal lead 127, and thus to second driver 21. First light-receiving device 14 and light-receiving die 144 receive light from first light-emitting device 12 and light-emitting die 140. The coupling of the light from die 140 to 144 may be enhanced by a body 149 of a light transmissive material that is disposed over the dice, as shown by the dashed outline in the figure. A layer of reflective or partially reflective material may be disposed over the top of body 149 to further enhance the coupling of light.

In the exemplary substrate 110 shown in the figures, body 115 of electrically insulating material is molded around the components (e.g., leads and die attach regions) of leadframe 120 before bodies 180A and 180B are molded around substrate 110. For this reason, substrate 110 (as well as substrate 210 described below) may be referred to as a pre-molded substrate. There is typically, but not necessarily, a discernable boundary between body 115 and each of bodies 180A and 180B that can be seen by visual inspection of a cross-section of the package seen through a microscope, even in cases where bodies 115, 180A, 180B comprise the same molding material.

With the above construction, two optocouplers may be disposed in a single package, with one optocoupler disposed on each side of an intermediate substrate. This enables two optocouplers to be provided in a smaller sized package, with at least a 30% to 40% reduction in volume. This reduction reduces the material costs of the package. As a further advantage, the use of the pre-molded leadframe substrate 110 eliminates the need to use temporary paper and ribbon supports to form bodies of light transmissive material (e.g., optical gel) on unmolded leadframe (as is conventionally done). This eliminates the prior art processes of adhering a paper back support and ribbon tape to an unmolded leadframe prior to dispensing and curing the optical gel and thereafter removing the paper and ribbon, thereby saving processing time and cost. The construction and smaller size of package 100 also enables the lengths of the wirebonds to be significantly shorter than the lengths in prior art packages, thereby improving electrical performance and reducing bond wire sweep risks (e.g., risks of breakage and electrical shorting in the wirebonds due to the routing of wirebonds over long distances with narrow angular separation between adjacent wirebonds). As a further advantage, the substrate's body 115 of electrically insulating material may comprise an optically opaque material to increase the optical isolation between optocouplers 10 and 20. As a further advantage, the optocouplers can be provided in an SO-8 style package with the feet 123 of leads 124 flush with the bottom surface of second molding body 180B.

Figure 5:
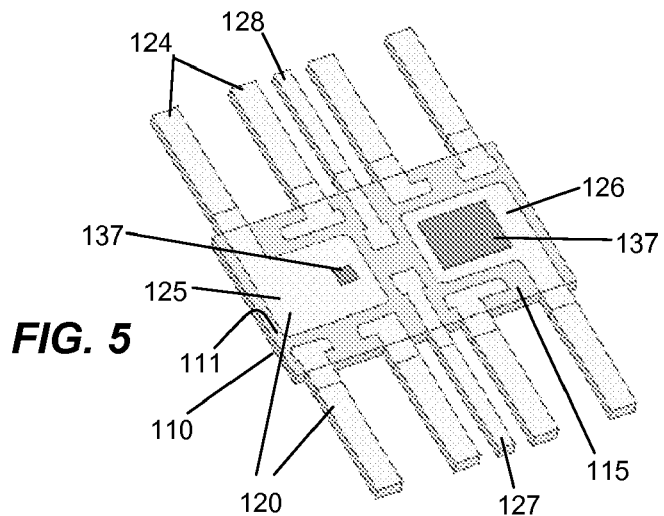
FIGS. 5-12 illustrate an exemplary method of manufacturing the exemplary semiconductor die package shown in FIG. 1 according to the present invention.

An exemplary method of manufacturing device 100 is illustrated by FIGS. 5-12. Referring to FIG. 5, substrate 110 is obtained. It may be procured from a vendor that has constructed substrate 110 according to the teaching of the present application, or it may be manufactured by conventional leadframe manufacturing and molding processes known to the art, or other substrate formation processes known to the art. For example, leadframe 120 may be manufactured by stamping or etching a sheet of metal with the pattern of leads 124, regions 125-126, and internal leads 127-128, and thereafter disposing body 115 of electrically insulating material in the interior portion of the leadframe, while leaving the major surfaces of the leadframe exposed, using a molding process. Also shown in FIG. 5, layers 137 of adhesive are disposed on die attach regions 125-126 at the locations where dice 130 and 134 are to be placed. Layers 137 may comprise solder or conductive paste, and may comprise a non-conductive adhesive if an electrical connection is not required at the back surface of the die. Silver paste is an exemplary conductive paste that may be used. Layers 137 may be disposed by screen printing.

Figure 6:
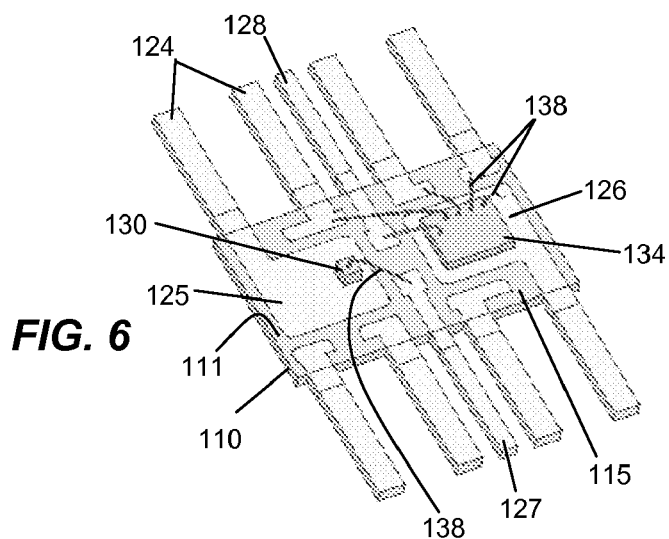
Figure 7:
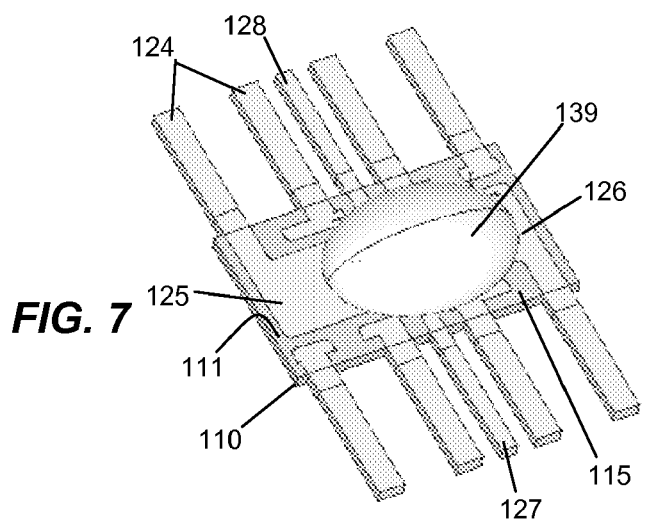
Figure 8:
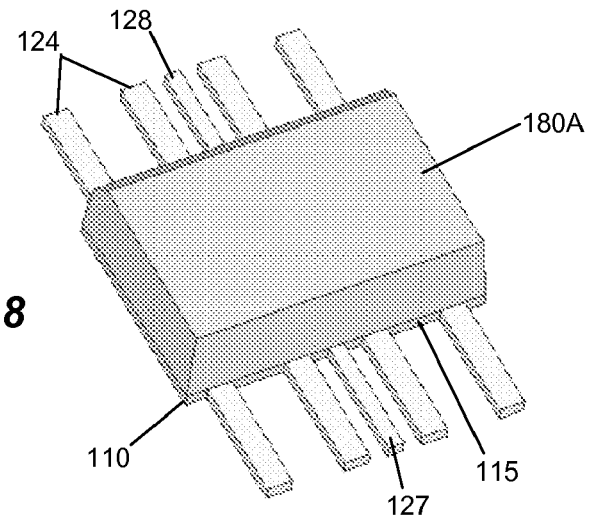

Referring to FIG. 6, dice 130 and 134 are assembled with substrate 110 at the locations of layers 137, and wirebonds 138 are attached between the dice and the leads of leadframe 120. Referring to FIG. 7, body 139 of a light transmissive material is disposed over and between dice 130 and 134. An optical gel conventionally used for optocouplers may be used. As an optional action, a partially or fully reflective layer may be disposed over body 139. Referring to FIG. 8, body 180A of molding material is formed over body 139 and the exposed portion of substrate 110 at the substrate's top surface 111. A conventional molding process may be used. If body 180A itself is selected as a white reflective (partially or fully) opaque epoxy material, then it may take the place of the aforementioned optional reflective layer deposited on body 139, and the aforementioned optional reflective layer may be omitted.

Figure 9:
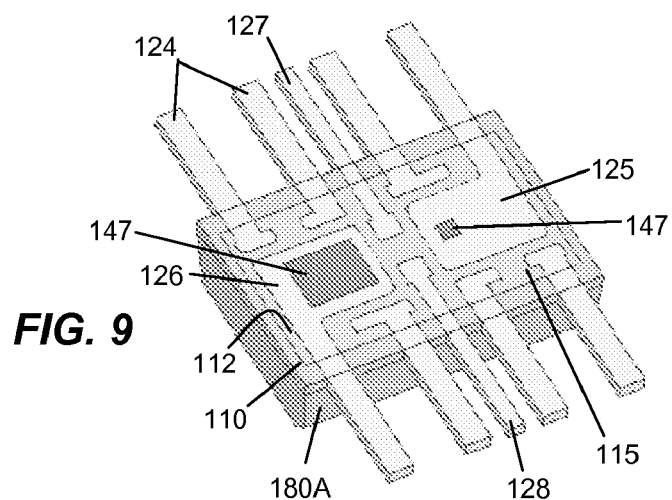

FIG. 9 shows the bottom surface 112 of substrate 110. Layers 147 of adhesive are disposed on die attach regions 125-126 at the locations where dice 140 and 144 are to be placed. Layers 147 may comprise solder or conductive paste, and may comprise a non-conductive adhesive if an electrical connection is not required at the back surface of the die. Silver paste is an exemplary conductive paste that may be used. Layers 147 may be disposed by screen printing.

Figure 10:
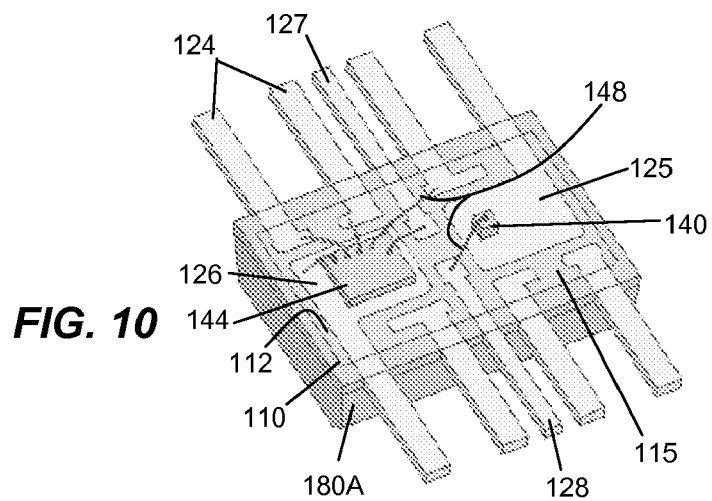
Figure 11:
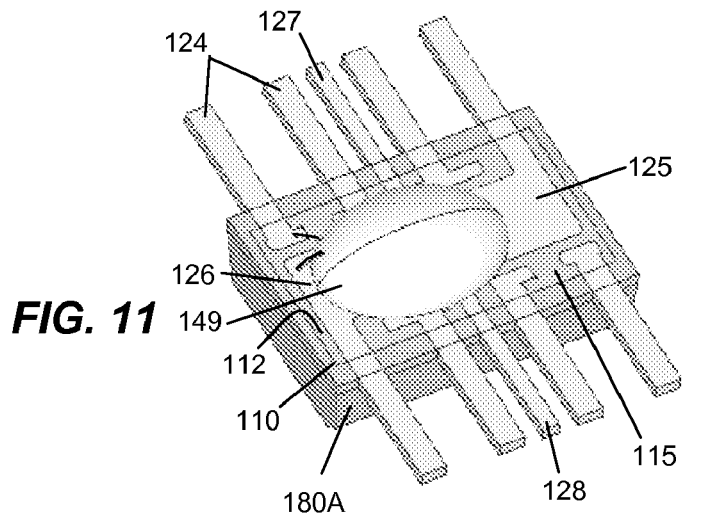
Figure 12:
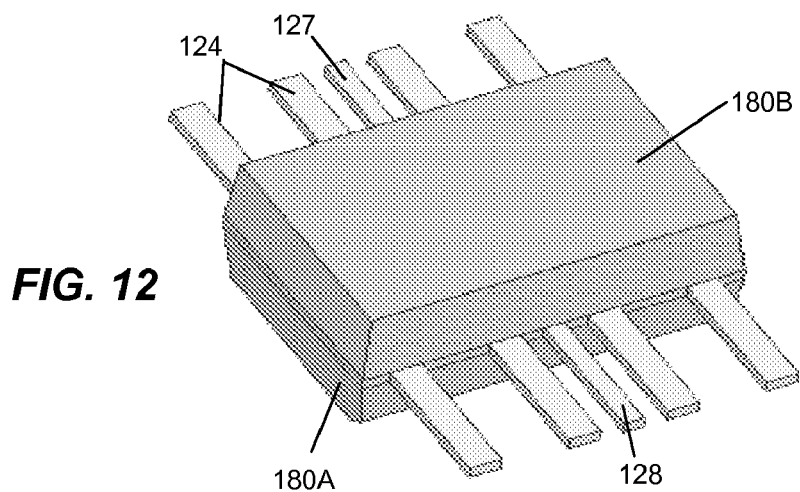

Referring to FIG. 10, dice 140 and 144 are assembled with substrate 110 at the locations of layers 147, and wirebonds 148 are attached between the dice and the leads of leadframe 120. Referring to FIG. 11, body 149 of a light transmissive material is disposed over and between dice 140 and 144. An optical gel conventionally used for optocouplers may be used. As an optional action, a partially or fully reflective layer may be disposed over body 149. Referring to FIG. 12, body 180B of molding material is formed over body 149 and the exposed portion of substrate 110 at the substrate's bottom surface 112. A conventional molding process may be used. If body 180B itself is selected as a white reflective (partially or fully) opaque epoxy material, then it may take the place of the aforementioned optional reflective layer deposited on body 149, and the aforementioned optional reflective layer may be omitted. At this point, the package may be separated from the leadframe carrier tape (e.g., singulated), the distal ends of internal leads 127 and 128 may be trimmed away so the ends of the internal leads are flush with the package, and any excess molding flash may be removed. These actions may be done substantially at the same time by a single cutting operation. Finally, the leads 124 may be bent into position by conventional forming equipment, the resulting package being shown by FIG. 1.

Figure 13:
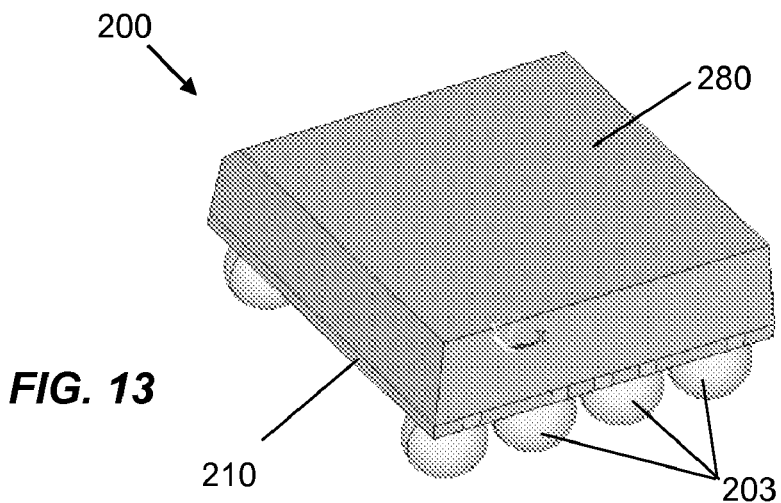
FIG. 13 shows a perspective view of a second exemplary semiconductor die package that incorporates multiple optocouplers according to the present invention.

FIG. 13 shows a second exemplary embodiment 200 of an optoelectronic package according to the present invention. Package 200 comprises a molded leadless package with ball grid array (MLP-BGA)) form, whereas package 100 comprises a molded lead package form. Package 200 comprises a base substrate 210 for holding a plurality of components, a body 280 of molding material disposed over the top surface of substrate 210 and encapsulating components disposed at the substrate's top surface, and a plurality of interconnect bumps 203 at the bottom surface of substrate 210. Body 280 may comprise an epoxy molding compound (EMC) and the like. Package 200 houses the previously described optocouplers 10 and 20.

Figure 14:
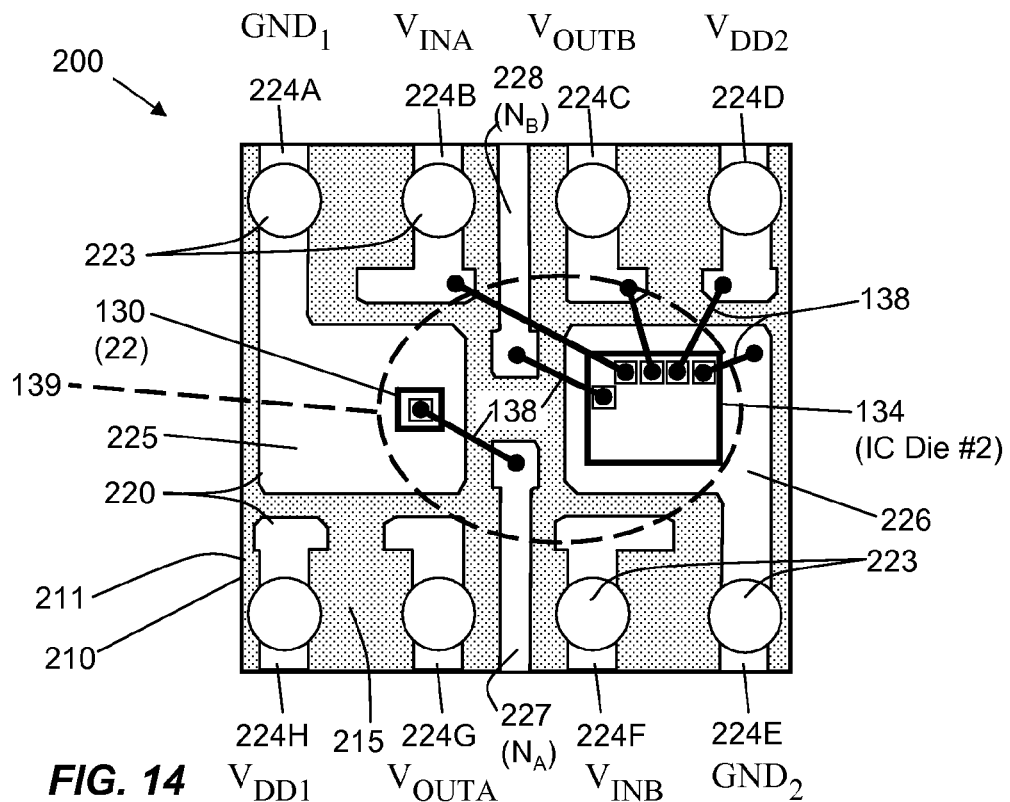
FIGS. 14 and 15 show top and bottom plan views, respectively, of the exemplary semiconductor die package shown in FIG. 13, with molding material removed to show housed components, according to the present invention.

FIG. 14 shows a top plan view of package 200 with molding body 280 removed to show the components mounted on a top surface 211 of substrate 210. Substrate 210 generally comprises a top surface 211, a bottom surface 212, and a plurality of conductive regions disposed on surfaces 211 and 212. In one implementation, it may comprise a leadframe 220 having a first die attach region 225, a second die attach region 226, a plurality of leads 224 with integrated interconnect pads 223, a first internal lead 227, and a second internal lead 228, with components 223-228 providing the substrate's conductive regions. This implementation of substrate 210 may further comprise a body 215 of electrically insulating material disposed between the components 223-228 of leadframe 220.

The leads 224 of leadframe 220 are identified as leads 224A-224H in the figure, and the corresponding circuit voltages and signals of FIG. 2 are shown at the distal ends of the leads. First die attach region 225 is electrically and physically coupled to lead 224A (and voltage $GND_1$), and second die attach region 226 is electrically and physically coupled to lead 224E (and voltage $GND_2$). Interconnect bumps 203 are disposed on respective interconnect pads 223 at bottom surface 212 of substrate 210. Body 215 may comprise an epoxy (such as an epoxy molding compound), a silicone, and/or a polyimide (i.e., it may comprise one or more of these materials). Body 215 of electrically insulating material is molded around the components (e.g., leads and die attach regions) of leadframe 220 before body 280 is molded over substrate 210. For this reason, substrate 210 (as well as substrate 210 described below) may be referred to as a pre-molded substrate. There is typically, but not necessarily, a discernable boundary between bodies 215 and 280 that can be seen by visual inspection of a cross-section of the package seen through a microscope, even in cases where bodies 215 and 280 comprise the same material. In other implementations, substrate 210 may comprise a printed circuit board, a flex circuit substrate, a ceramic substrate, or the like.

The same dice 130, 134, 140, and 144 used in package 100 may be used in package 200. Light-emitting die 130, which houses second light-emitting device 22 of second optocoupler 20 (shown in FIG. 2), may be disposed on first die attach region 225 at the top surface 211 of substrate 210. Light-emitting die 130 may have a backside electrode that is electrically coupled to first die attach region 225 by a conductive adhesive, such as solder, and a topside electrode that is electrically coupled to first internal lead 227 of leadframe 220 by a wirebond 138. (The top electrode is shown as a small square in the center of die 130.) First internal lead 227 provides node $N_A$ of second optocoupler 20 shown in FIG. 2. As described below in greater detail, internal lead 227 is electrically coupled to a driver 21 on die 144 that is disposed on a bottom surface 212 of substrate 210. Instead of a backside electrode electrically coupled to die attach region 225, light-emitting die 130 may comprise a second topside electrode that is electrically coupled to region 225 by a wirebond.

Light-receiving die 134 is disposed on second die attach region 226 at the top surface 211 of substrate 210; it houses second light-receiving device 24 and second amplifier 26 of second optocoupler 20 (shown in FIG. 2), as well as first driver 11 of first optocoupler 10 (shown in FIG. 2). Light-receiving die 134 may have a backside electrode that is electrically coupled to second die attach region 226 by a conductive adhesive, such as solder, and has a plurality of topside electrodes that are electrically coupled to leads 224B-224D, die region 226, and a second internal lead 228 of leadframe 220 by respective wirebonds 138, as shown in the figure. (As before, the top electrodes are shown as respective small squares on the top surface of die 134.) The aforementioned wirebonds interconnect second light-receiving device 24 to ground $GND_2$, interconnect second amplifier 26 to supply voltage $VDD_2$, ground $GND_2$, and signal $V_{OUTB}$, and interconnect first driver 11 to input signal $V_{INA}$, supply voltage $VDD_2$ ground $GND_2$, and second internal lead 228. As described below, first light-emitting device 12 is housed by die 140 disposed on the opposite side of substrate 210, and is electrically coupled to second internal lead 228, and thus to first driver 11. Second light-receiving device 24 and light-receiving die 134 receive light from second light-emitting device 22 and light-emitting die 130. The coupling of the light from die 130 to 134 may be enhanced by a body 139 of a light transmissive material that is disposed over the dice, as shown by the dashed outline in the figure. A layer of reflective or partially reflective material may be disposed over the top of body 139 to further enhance the coupling of light.

Figure 15:
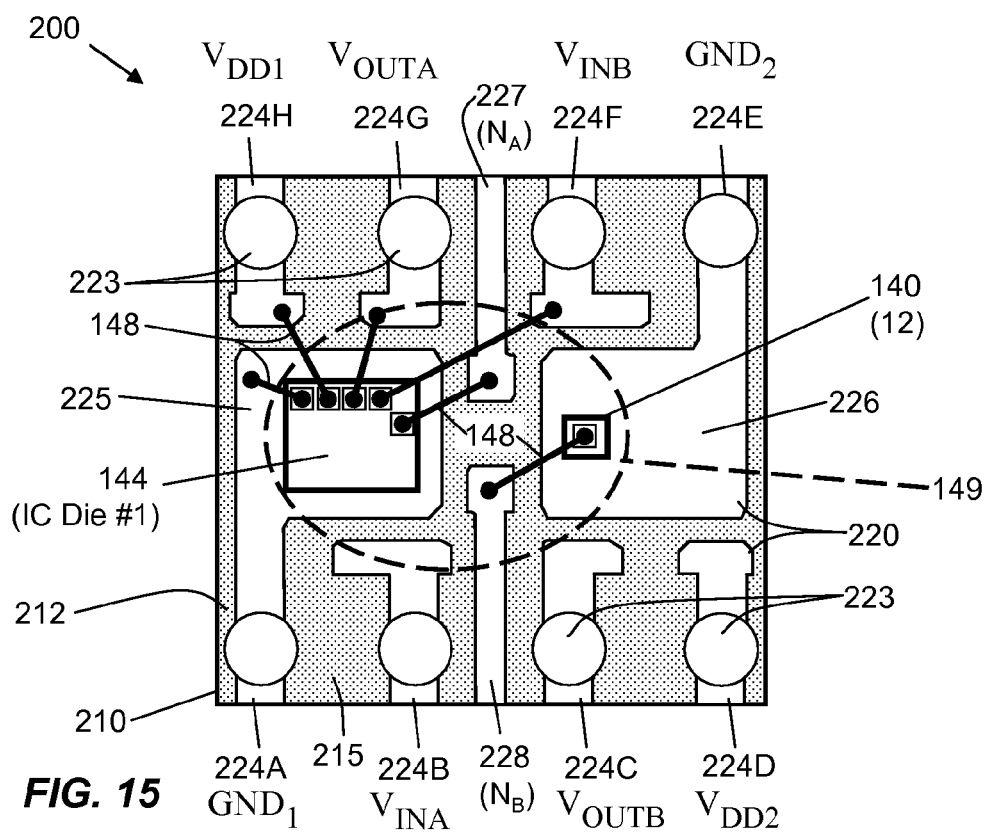

FIG. 15 shows a bottom plan view of package 200 to show the components mounted on a bottom surface 212 of substrate 210, with the exception of interconnect bumps 203. The corresponding circuit voltages and signals of FIG. 2 for the leads 224A-224H are shown at the distal ends of the leads, and the bottom surfaces of die attach regions 225 and 226 can be seen. Light-emitting die 140 houses first light-emitting device 12 of first optocoupler 10 (shown in FIG. 2), and is disposed on second die attach region 226 at the bottom surface 212 of substrate 210. Light-emitting die 140 may have a backside electrode that is electrically coupled to second die attach region 226 by a conductive adhesive, such as solder, and a topside electrode that is electrically coupled to second internal lead 228 of leadframe 120 by a wirebond 148. (The top electrode is shown as a small square in the center of die 140.) Second internal lead 228 provides node $N_B$ of second optocoupler 10 shown in FIG. 2. As previously described above, internal lead 228 is electrically coupled to first driver 11 on die 134 that is disposed on the top surface 211 of substrate 210; thus first light-emitting device 12 is electrically coupled to first driver 11 on the opposite side of substrate 210. Instead of a backside electrode electrically coupled to die attach region 226, light-emitting die 140 may comprise a second topside electrode that is electrically coupled to region 226 by a wirebond.

Light-receiving die 144 is disposed on first die attach region 225 at the bottom surface 212 of substrate 210; it houses first light-receiving device 14 and first amplifier 16 of first optocoupler 10 (shown in FIG. 2), as well as second driver 21 of second optocoupler 20 (shown in FIG. 2). Light-receiving die 144 may have a backside electrode that is electrically coupled to first die attach region 225 by a conductive adhesive, such as solder, and has a plurality of topside electrodes that are electrically coupled to die region 225, leads 224F-224H, and first internal lead 227 of leadframe 220 by respective wirebonds 148, as shown in the figure. (The top electrodes are shown as respective small squares on the top surface of die 144.) The aforementioned wirebonds interconnect first light-receiving device 14 to ground $GND_1$, interconnect first amplifier 16 to supply voltage $VDD_1$, ground $GND_1$, and signal $V_{OUTA}$, and interconnect second driver 21 to input signal $V_{INB}$, supply voltage $VDD_1$ ground $GND_1$, and first internal lead 227. As described above, second light-emitting device 22 is housed by die 130 disposed on the opposite side of substrate 210, and is electrically coupled to first internal lead 227, and thus to second driver 21. First light-receiving device 14 and light-receiving die 144 receive light from first light-emitting device 12 and light-emitting die 140. The coupling of the light from die 140 to 144 may be enhanced by a body 149 of a light transmissive material that is disposed over the dice, as shown by the dashed outline in the figure. A layer of reflective or partially reflective material may be disposed over the top of body 149 to further enhance the coupling of light.

Package 200 provides the same advantages over the prior art as package 100, with the exception that package 200 can be made smaller than package 100 (no distal leads and no underside molding material), and the optocouplers may be provided in a BGA style package. Additionally, the substrate's body 215 of electrically insulating material may comprise an optically opaque material to increase the optical isolation between optocouplers 10 and 20.

Figure 16:
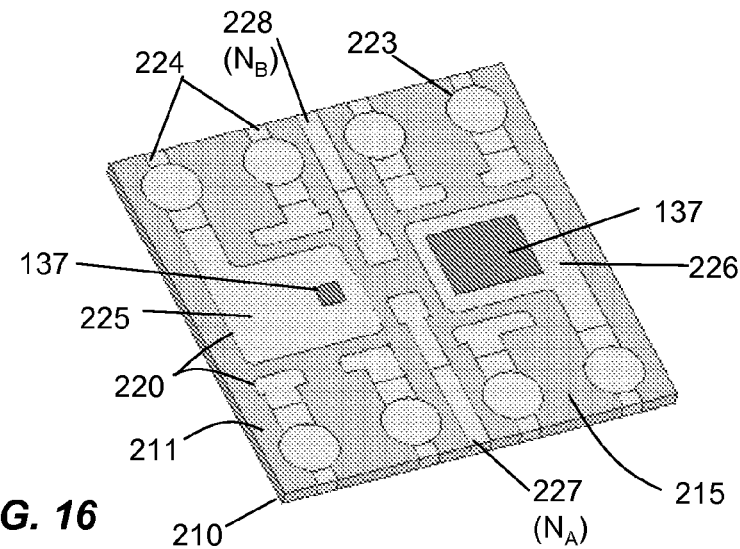
FIGS. 16-24 illustrate an exemplary method of manufacturing the exemplary semiconductor die package shown in FIG. 13 according to the present invention.

An exemplary method of manufacturing device 200 is illustrated by FIGS. 16-24. Referring to FIG. 16, substrate 210 is obtained. It may be procured from a vendor that has constructed substrate 210 according to the teaching of the present application, or it may be manufactured by conventional leadframe manufacturing and molding processes known to the art, or other substrate formation processes known to the art. For example, in one implementation, leadframe 220 may be manufactured by stamping or etching a sheet of metal with the pattern of leads 224, regions 225-226, and internal leads 227-228, and thereafter disposing body 215 of electrically insulating material in the interior portion of the leadframe, while leaving the major surfaces of the leadframe exposed, using a molding process. Also shown in FIG. 16, layers 137 of adhesive are disposed on die attach regions 225-226 at the locations where dice 130 and 134 are to be placed. Layers 137 may comprise solder or conductive paste, and may comprise a non-conductive adhesive if an electrical connection is not required at the back surface of the die. Silver paste is an exemplary conductive paste that may be used. Layers 137 may be disposed by screen printing.

Figure 17:
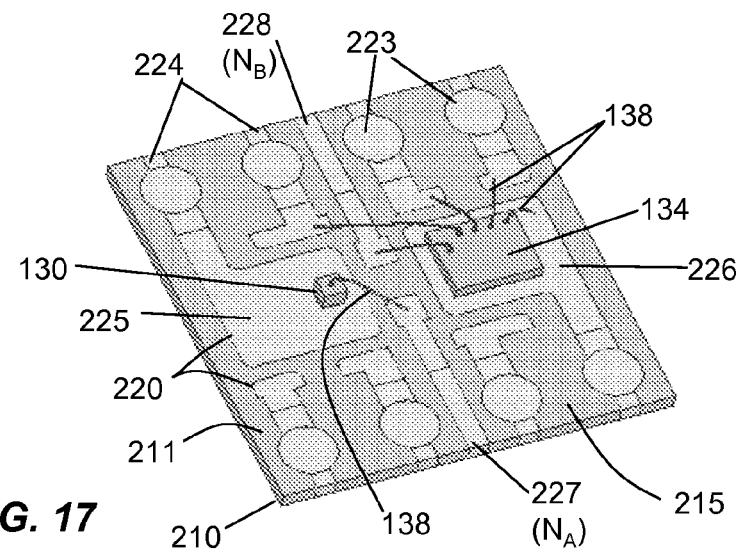
Figure 18:
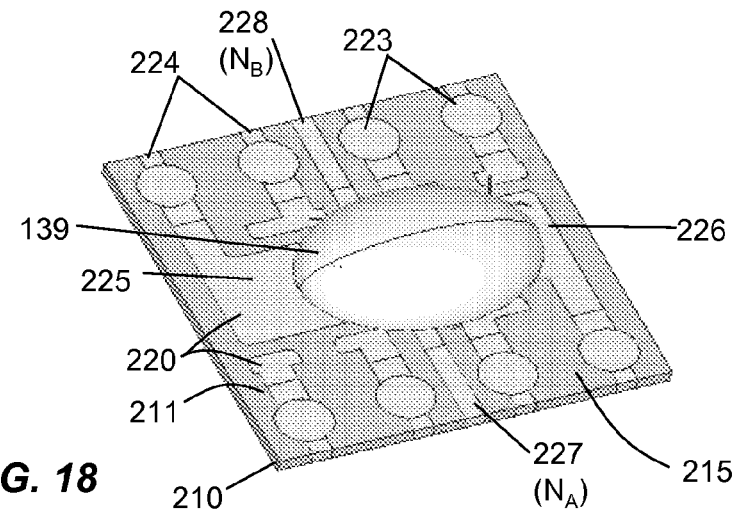
Figure 19:
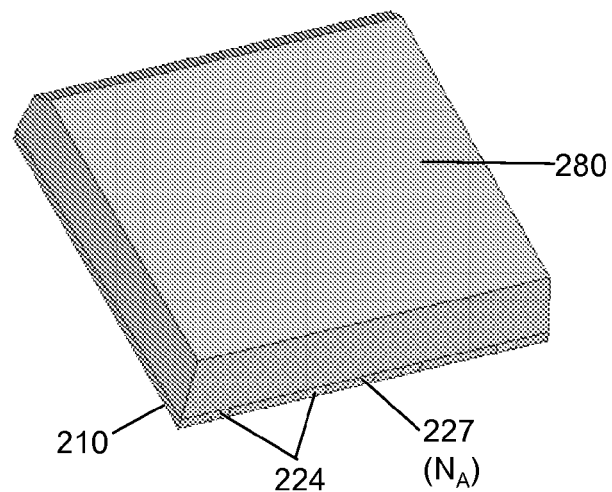

Referring to FIG. 17, dice 130 and 134 are assembled with substrate 210 at the locations of layers 137, and wirebonds 138 are attached between the dice and the leads of leadframe 220. Referring to FIG. 18, body 139 of a light transmissive material is disposed over and between dice 130 and 134. An optical gel conventionally used for optocouplers may be used. As an optional action, a partially or fully reflective layer may be disposed over body 139. Referring to FIG. 19, body 280 of molding material is formed over body 139 and the exposed portion of substrate 210 at the substrate's top surface 211. A conventional molding process may be used. The body 280 may be a regular mold compound material or may be a white reflective opaque epoxy material. If body 280 itself is selected as a white reflective (partially or fully) opaque epoxy material, the option of deposition of a reflective layer on body 139 may be omitted.

Figure 20:
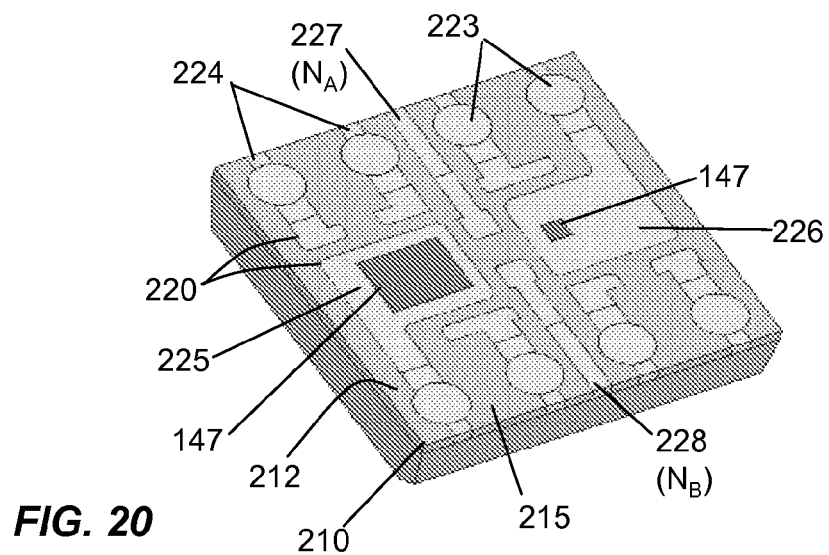

FIG. 20 shows the bottom surface 212 of substrate 210. Layers 147 of adhesive are disposed on die attach regions 225-226 at the locations where dice 140 and 144 are to be placed. Layers 147 may comprise solder or conductive paste, and may comprise a non-conductive adhesive if an electrical connection is not required at the back surface of the die. Silver paste is an exemplary conductive paste that may be used. Layers 147 may be disposed by screen printing.

Figure 21:
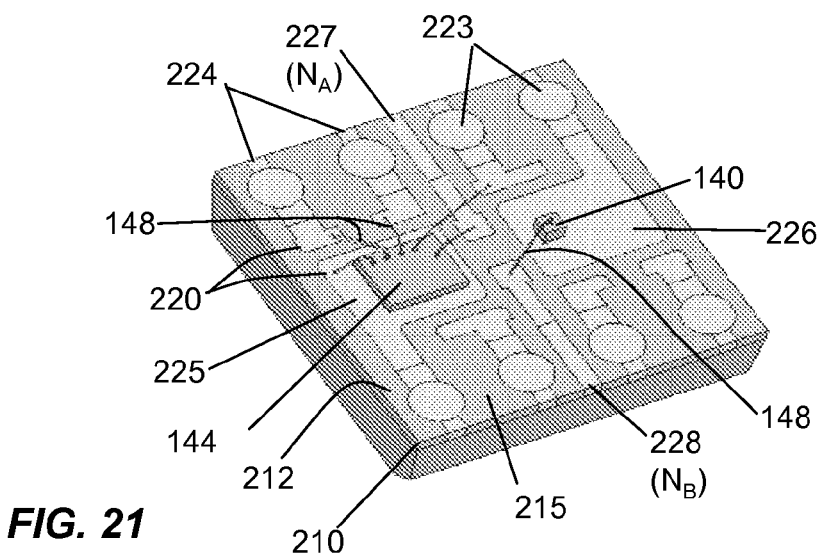
Figure 22:
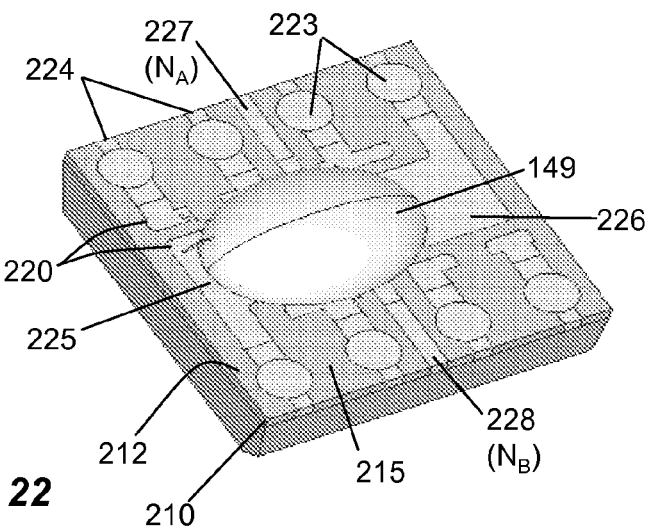
Figure 23:
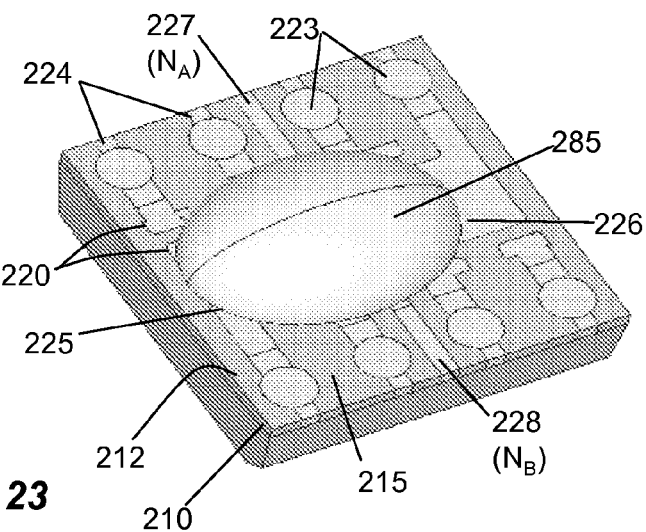
Figure 24:
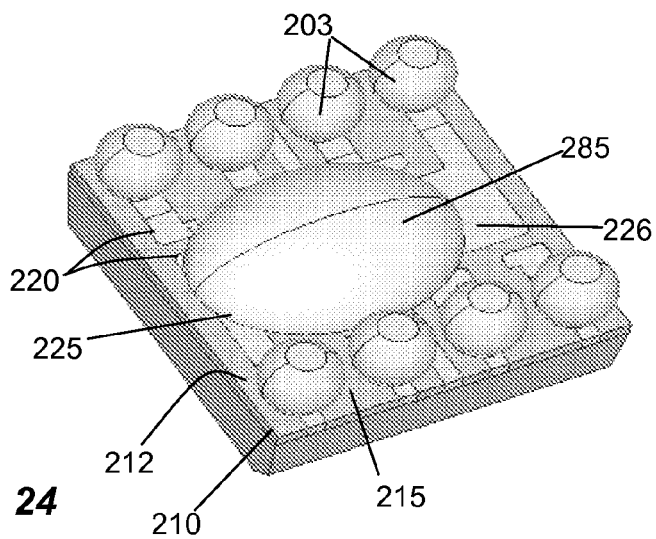

Referring to FIG. 21, dice 140 and 144 are assembled with substrate 210 at the locations of layers 147, and wirebonds 148 are attached between the dice and the leads of leadframe 220. Referring to FIG. 22, body 149 of a light transmissive material is disposed over and between dice 140 and 144. An optical gel conventionally used for optocouplers may be used. As an optional action, a partially or fully reflective layer may be disposed over body 149. Referring to FIG. 23, a body 285 of molding material is formed over body 149 and some of the exposed portion of substrate 210 at the substrate's bottom surface 212, but clear of interconnect pads 223. A conventional molding process may be used. Referring to FIG. 24, interconnect bumps 203 may be disposed and attached to respective interconnect pads 223. At this point, if substrate 210 was provided as part of a leadframe carrier tape, the package may be separated from the leadframe carrier tape (e.g., singulated), and any excess molding flash may be removed. These actions may be done substantially at the same time by a single cutting operation.

Figure 25:
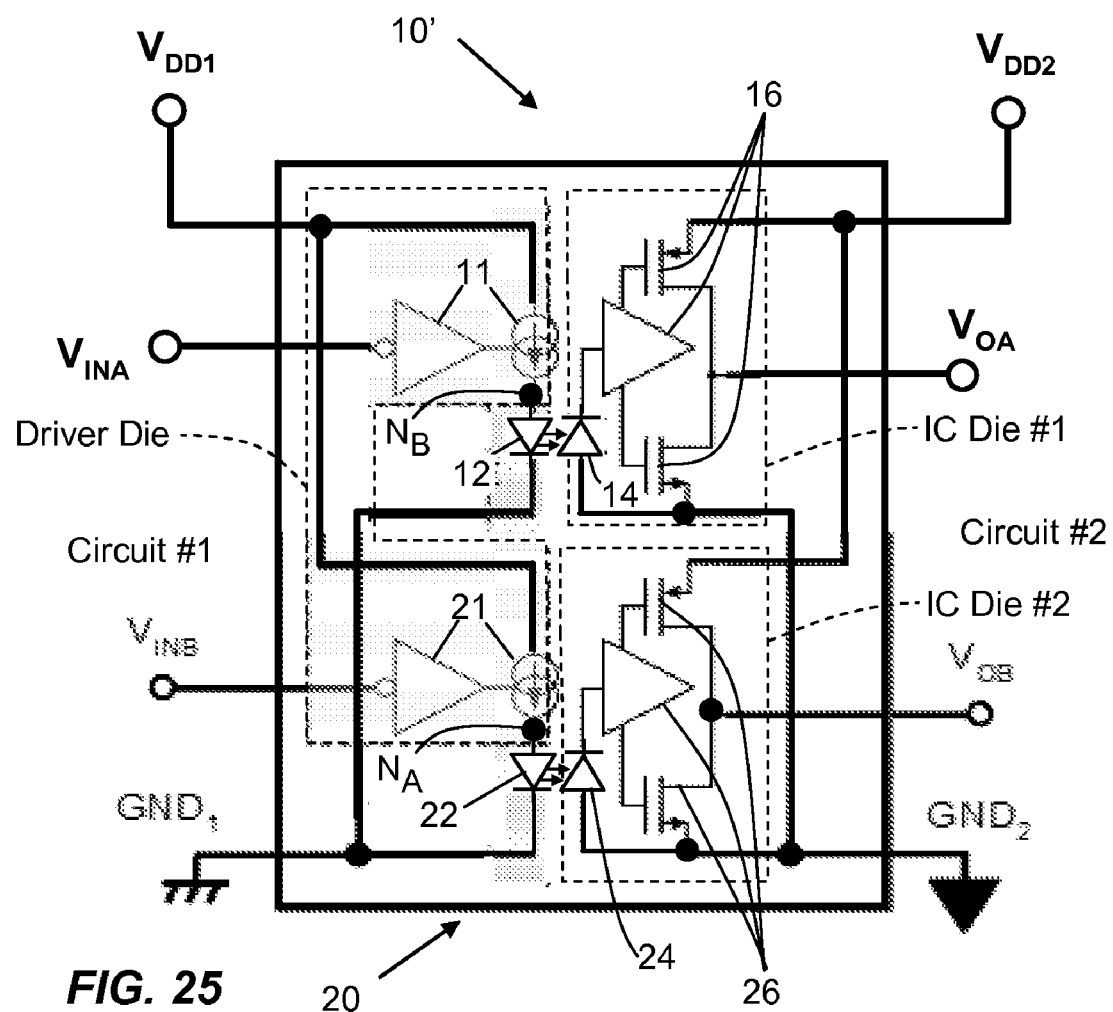
FIG. 25 shows a schematic diagram of another exemplary circuitry for multiple optocouplers that may be housed by an exemplary semiconductor die package that incorporates multiple optocouplers according to the present invention.
Figure 26:
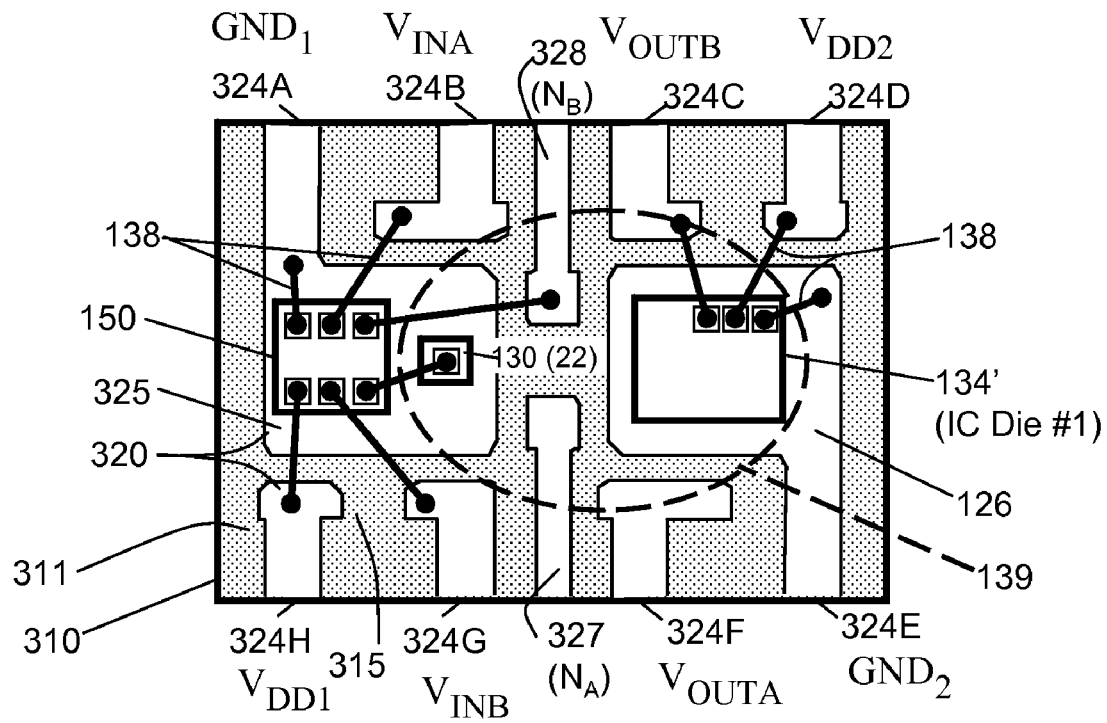
FIGS. 26 and 27 show top and bottom plan views, respectively, of an exemplary substrate with components disposed thereon, which may be used in semiconductor die packages described herein, according to the present invention.
Figure 27:
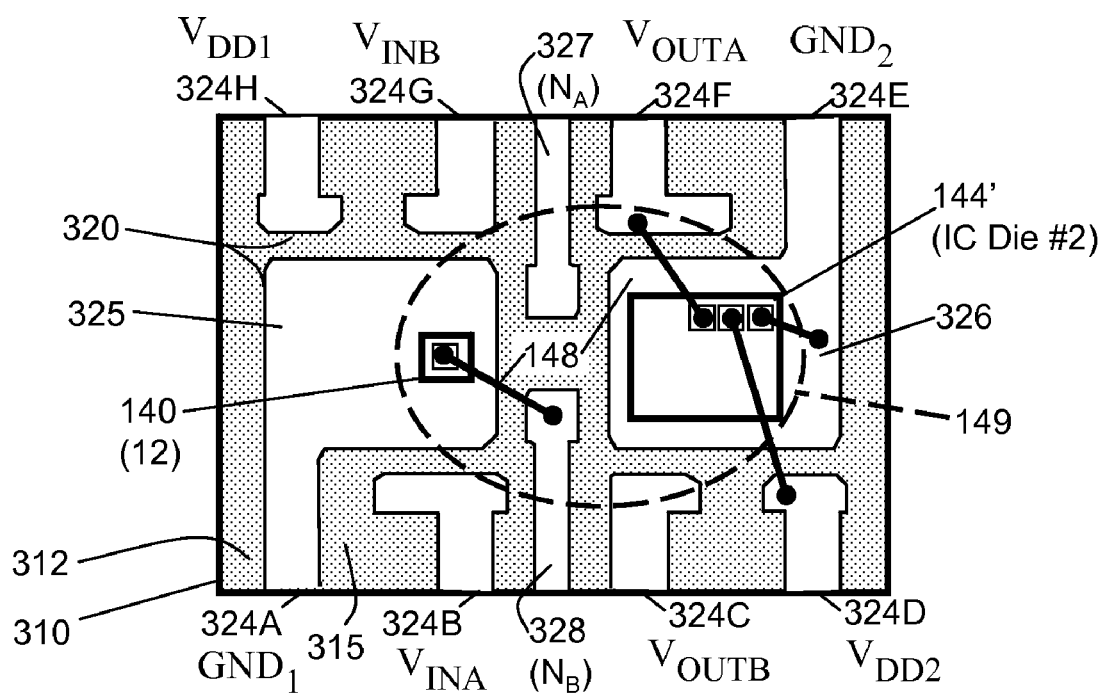

In the exemplary circuitry for multiple optocouplers shown in FIG. 2, optocoupler 10 conveys the electrical signal $V_{INA}$ from Circuit #2 to Circuit #1 as electrical signal $V_{OA}$, and optocoupler 20 conveys the electrical signal $V_{INB}$ from Circuit #1 to Circuit #2 as electrical signal $V_{OB}$. In some applications, there is a need to convey two or more signals from Circuit #1 to Circuit #2 (or vice versa). FIG. 25 shows an exemplary circuit that comprises an optocoupler 10' and previously described optocoupler 20 that convey signals $V_{INA}$ and $V_{INB}$, respectively, from Circuit #1 to Circuit #2 as electrical signals $V_{OA}$ and $V_{OB}$, respectively. Optocoupler 10' is the same as optocoupler 10, but has different connections (e.g., is turned by 180 degrees). In this implementation, drivers 11 and 21 are not integrated on the light receiving dice 134 and 144. Instead, they are integrated on a separate die, or with their respective light-emitting devices on the light emitting dice. As the semiconductor material for light emitting dice is currently more expensive that silicon, and since the drivers can be integrated on a silicon die, it is generally less expensive at the present time to integrate drivers 11 and 21 on a separate silicon die. FIGS. 26 and 27 show an exemplary layout of dice for such a configuration on an exemplary substrate 310 that has a first surface 311, which is shown in FIG. 26 as the top plan view of substrate 310, and a second surface 312 which is shown in FIG. 27 as the bottom plan view of substrate 310. Substrate 310 may have the same construction as substrates 110 and 210, and may be further configured to have the extended leads of substrate 110 or the interconnect pads 223 of substrate 210, and may be used in a package like package 100 or a package like package 200. The leads of leadframe 320 are identified as leads 324A-324H; they may have the same shapes as leads 124A-124H or leads 224A-224H, and they have the same corresponding circuit voltages and signals with the exception that locations of signals $V_{OUTA}$ and $V_{INB}$ are exchanged. Leadframe 320 further comprises a first die attach region 325 electrically and physically coupled to lead 324A (and voltage $GND_1$), and a second die attach region 326 electrically and physically coupled to lead 324E (and voltage $GND_2$). Body 315 of electrically insulating material is disposed between leads 324 and die attach regions 325 and 326. Lead frame 320 also comprises first and second internal leads 327 and 328, respectively.

The same dice 130, 134, 140, and 144 used in packages 100 and 200 may be mounted on substrate 310. However, this embodiment is illustrated with versions 134' and 144' of dice 134 and 144 which are the same as dice 134 and 144, but do not have the drivers 11 and 12. Referring to FIG. 26, drivers 11 and 12 are integrated together on a die 150, which is disposed on first die attach region 325 at the first surface 311 of substrate 130, along with light-emitting die 130. Die 150 has four input electrodes to receive $VDD_1$, $GND_1$, $V_{INA}$, and $V_{INB}$, and two output electrodes to provide drive signals to light-emitting devices 12 and 22. The four input electrodes are coupled to leads 324H, 324A, 325B, and 324G by respective wirebonds 138. The output electrode for the drive signal to second light-emitting device 22 is electrically coupled to the top electrode on die 130 by a respective wirebond 138. The output electrode for the drive signal to first light-emitting device 12 is electrically coupled to second internal lead 328 by a respective wirebond 138, which in turn is electrically coupled to first light-emitting device 22 on the other side of substrate 310 by another wirebond. The bottoms of dice 150 and 130 may be electrically coupled to die attach region 325, while the die attach material for attaching die 150 may comprise a non-conductive adhesive material.

Light-receiving die 134' is disposed on second die attach region 326 at the top surface 311 of substrate 310; it houses second light-receiving device 24 and second amplifier 26 of second optocoupler 20 (shown in FIG. 25). Light-receiving die 134' may have a backside electrode that is electrically coupled to second die attach region 326 by a conductive adhesive, such as solder, and has a plurality of topside electrodes that are electrically coupled to leads 224C-224D and die region 326 by wirebonds 138, as shown in the figure. (As before, the top electrodes are shown as respective small squares on the top surface of die 134'.) The aforementioned wirebonds interconnect second light-receiving device 24 to ground $GND_2$, and interconnect second amplifier 26 to supply voltage $VDD_2$ ground $GND_2$, and signal $V_{OUTB}$. Second light-receiving device 24 and light-receiving die 134' receive light from second light-emitting device 22 and light-emitting die 130. The coupling of the light from die 130 to 134' may be enhanced by a body 139 of a light transmissive material that is disposed over the dice, as shown by the dashed outline in the figure. A layer of reflective or partially reflective material may be disposed over the top of body 139 to further enhance the coupling of light.

Referring to FIG. 27, light-emitting die 140 houses first light-emitting device 12 of first optocoupler 10' (shown in FIG. 25), and is disposed on first die attach region 325 at the bottom surface 312 of substrate 310. Light-emitting die 140 may have a backside electrode that is electrically coupled to first die attach region 325 by a conductive adhesive, such as solder, and a topside electrode that is electrically coupled to second internal lead 328 of leadframe 320 by a wirebond 148. Second internal lead 328 provides node $N_B$ of second optocoupler 10' shown in FIG. 25. As previously described above, internal lead 328 is electrically coupled to first driver 11 on die 150 that is disposed on the top surface 311 of substrate 310; thus first light-emitting device 12 is electrically coupled to first driver 11 on the opposite side of substrate 310. Instead of a backside electrode electrically coupled to die attach region 325, light-emitting die 140 may comprise a second topside electrode that is electrically coupled to region 325 by a wirebond.

Light-receiving die 144' is disposed on second die attach region 326 at the bottom surface 312 of substrate 310; it houses first light-receiving device 14 and first amplifier 16 of first optocoupler 10' (shown in FIG. 25). Light-receiving die 144' may have a backside electrode that is electrically coupled to second die attach region 326 by a conductive adhesive, such as solder, and has a plurality of topside electrodes that are electrically coupled to die region 326 and leads 324D-324F by wirebonds 148, as shown in the figure. (The top electrodes are shown as respective small squares on the top surface of die 144'.) The aforementioned wirebonds interconnect first light-receiving device 14 to ground $GND_1$, and interconnect first amplifier 16 to supply voltage $VDD_1$, ground $GND_1$ and signal $V_{OUTA}$. First light-receiving device 14 and light-receiving die 144' receive light from first light-emitting device 12 and light-emitting die 140. The coupling of the light from die 140 to 144' may be enhanced by a body 149 of a light transmissive material that is disposed over the dice, as shown by the dashed outline in the figure. A layer of reflective or partially reflective material may be disposed over the top of body 149 to further enhance the coupling of light.

The above components may be assembled onto substrate 310 using any of the previously described methods.

It should be understood that where the performance of an action of any of the methods disclosed and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not limited to the order of the actions listed in the claim language, but instead cover all possible orderings, including simultaneous and interleaving performance of actions and other possible orderings not explicitly described above, unless otherwise specified by the claim language (such as by explicitly stating that one action precedes or follows another action).

The semiconductor die packages described above can be used in electrical assemblies including circuit boards with the packages mounted thereon. They may also be used in systems such as power converters, computers, communication equipment, etc. It may be appreciated that additional optoelectronic dice may be assembled on either or both sides of the center substrate of each package, and conductive regions (e.g., leads) added to the substrate, to provide additional optocouplers.

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the invention claimed.

Moreover, one or more features of one or more embodiments of the invention may be combined with one or more features of other embodiments of the invention without departing from the scope of the invention.

While the present invention has been particularly described with respect to the illustrated embodiments, it will be appreciated that various alterations, modifications, adaptations, and equivalent arrangements may be made based on the present disclosure, and are intended to be within the scope of the invention and the appended claims.

What is claimed is:

1. An optocoupler package comprising:
a pre-molded substrate comprising a first surface, a second surface, a leadframe with a plurality of leads disposed between the substrate's first and second surfaces, a first body of molding material disposed between the leadframe's leads, and a plurality of conductive regions disposed at the first and second surfaces;
a first optoelectronic die disposed on the substrate's first surface;
a second optoelectronic die disposed on the substrate's first surface and optically coupled to the first optoelectronic die;
a third optoelectronic die disposed on the substrate's second surface; and
a fourth optoelectronic die disposed on the substrate's second surface and optically coupled to the third optoelectronic die.

2. The optocoupler package of claim 1, wherein the first body of molding material comprises an opaque molding material.

3. The optocoupler package of claim 1, wherein the first optoelectronic die comprises a first light-emitting device, wherein the second optoelectronic die comprises a first light receiving device, wherein the third optoelectronic die comprises a second light-emitting device, and wherein the fourth optoelectronic die comprises a second light receiving device.

4. The optocoupler package of claim 3, further comprising a first wirebond electrically coupled between the first optoelectronic die and a first lead of said plurality of leads;
a second wirebond electrically coupled between the fourth optoelectronic die and the first lead;

a third wirebond electrically coupled between the third optoelectronic die and a second lead of said plurality of leads; and a fourth wirebond electrically coupled between the second optoelectronic die and the second lead.

5. The optocoupler package of claim 4, further comprising a first die attach region electrically coupled to a third lead of the plurality of leads and a second die attach region electrically coupled to a fourth lead of the plurality of leads, and wherein the first and fourth optoelectronic dies are disposed on the first die attach region at the first and second surfaces of the substrate, respectively, and wherein the second and third optoelectronic dies are disposed on the second die attach region at the first and second surfaces of the substrate, respectively.

6. The optocoupler package of claim 3, further comprising a driver die disposed on the substrate's first surface;

a first wirebond electrically coupled between the driver die and a first lead of said plurality of leads;

a second wirebond electrically coupled between the third optoelectronic die and the first lead; and an electrical coupling between the driver die and the first optoelectronic die.

7. The optocoupler package of claim 6, wherein the electrical coupling between the driver die and the first optoelectronic die comprises a third wirebond electrically coupled between the driver die and the first optoelectronic die.

8. The optocoupler package of claim 6, further comprising a first die attach region electrically coupled to a second lead of the plurality of leads and a second die attach region electrically coupled to third lead of the plurality of leads, and wherein the first and third optoelectronic dies are disposed on the first die attach region at the first and second surfaces of the substrate, respectively, and wherein the second and fourth optoelectronic dies are disposed on the second die attach region at the first and second surfaces of the substrate, respectively.

9. The optocoupler package of claim 1, further comprising a first body of light transmissive material disposed on and between the first and second optoelectronic dies, and a second body of light transmissive material disposed on and between the third and fourth optoelectronic dies.

10. The optocoupler package of claim 9, further comprising a second body of molding material disposed over the first body of light transmissive material, and a third body of molding material disposed over the second body of light transmissive material.

11. The optocoupler package of claim 10, wherein the pre-molded substrate comprises a central portion, wherein a plurality of the leadframe's leads extend from the substrate's central portion, and wherein the central portion of the substrate is encased by the second and third bodies of molding material, and wherein the plurality of leads have distal portions that extend away from the first and second bodies of molding material.

12. The optocoupler package of claim 11, wherein the distal portion of at least one lead is bent in two locations to provide a foot that is coplanar with a surface of one of the bodies of molding material, the foot being at the distal end of the at least one lead.

13. The optocoupler package of claim 11, wherein there is a discernable boundary between the first body of molding material and at least one of the second and third bodies of molding material in at least one cross section of the optocoupler package.

14. The optocoupler package of claim 9, wherein portions of the pre-molded substrate's first surface are left exposed by the first body of light transmissive material, and wherein the optocoupler package further comprises a second body of molding material disposed over the first body of light transmissive material and the exposed portions of the substrate's first surface, and a plurality of interconnect pads disposed on the substrate's second surface, wherein the interconnect pads are left uncovered by the second body of light transmissive material.

15. The optocoupler package of claim 14, further comprising a plurality of interconnect bumps disposed on the plurality of interconnect pads.

16. The optocoupler package of claim 14, wherein there is a discernable boundary between the first and second bodies of molding material in at least one cross section of the optocoupler package.

17. A method comprising:

assembling a first optoelectronic die and a second optoelectronic die on a first surface of a pre-molded substrate, the second optoelectronic die being optically coupled to the first optoelectronic die, the pre-molded substrate further having a second surface, a leadframe with a plurality of leads disposed between the substrate's first and second surfaces, a first body of molding material disposed between the leadframe's leads, and a plurality of conductive regions disposed at the first and second surfaces; and assembling a third optoelectronic die and a fourth optoelectronic die on the second surface of the pre-molded substrate, the fourth optoelectronic die being optically coupled to the third optoelectronic die.

18. The method of claim 17, further comprising forming the pre-molded substrate prior to assembling the optoelectronic dies with the substrate.

19. The method of claim 17 further comprising:

disposing a first body of optically transmissive material on and between the first and second optoelectronic dies; and disposing a second body of optically transmissive material on and between the third and fourth optoelectronic dies.

20. The method of claim 17 further comprising:

disposing a second body of molding material on the first body of optically transmissive material; and disposing a third body of molding material on the second body of optically transmissive material.

21. The method of claim 19, wherein the pre-molded substrate comprises a plurality of conductive pads disposed on the substrate's second surface, wherein the second body of light transmissive material is disposed such that the conductive pads are left uncovered by the second body of light transmissive material.

22. The method of claim 19 further comprising disposing interconnect bumps on the conductive pads.

23. An optocoupler package comprising:

a substrate comprising a first surface, a second surface, and a plurality of conductive regions disposed at the first and second surfaces;

a first optoelectronic die disposed on the substrate's first surface, the first optoelectronic die comprising a first light-emitting device;

a second optoelectronic die disposed on the substrate's first surface and optically coupled to the first optoelectronic die, the second optoelectronic die comprising a first light receiving device;

a third optoelectronic die disposed on the substrate's second surface, the third optoelectronic die comprising a second light-emitting device;

a fourth optoelectronic die disposed on the substrate's second surface and optically coupled to the third optoelectronic die, the fourth optoelectronic die comprising a second light receiving device;

a first wirebond electrically coupled between the first optoelectronic die and a first lead of said plurality of leads;

a second wirebond electrically coupled between the fourth optoelectronic die and the first lead;

a third wirebond electrically coupled between the third optoelectronic die and a second lead of said plurality of leads; and a fourth wirebond electrically coupled between the second optoelectronic die and the second lead.

24. The optocoupler package of claim 23, further comprising a first die attach region electrically coupled to a third lead of the plurality of leads and a second die attach region electrically coupled to a fourth lead of the plurality of leads, and wherein the first and fourth optoelectronic dies are disposed on the first die attach region at the first and second surfaces of the substrate, respectively, and wherein the second and third optoelectronic dies are disposed on the second die attach region at the first and second surfaces of the substrate, respectively.

25. An optocoupler package comprising:

a substrate comprising a first surface, a second surface, and a plurality of conductive regions disposed at the first and second surfaces;

a first optoelectronic die disposed on the substrate's first surface, the first optoelectronic die comprising a first light-emitting device;

a second optoelectronic die disposed on the substrate's first surface and optically coupled to the first optoelectronic die, the second optoelectronic die comprising a first light receiving device;

a third optoelectronic die disposed on the substrate's second surface, the third optoelectronic die comprising a second light-emitting device;

a fourth optoelectronic die disposed on the substrate's second surface and optically coupled to the third optoelectronic die, the fourth optoelectronic die comprising a second light receiving device;

a driver die disposed on the substrate's first surface;

a first wirebond electrically coupled between the driver die and a first lead of said plurality of leads;

a second wirebond electrically coupled between the third optoelectronic die and the first lead; and an electrical coupling between the driver die and the first optoelectronic die.

26. The optocoupler package of claim 25, wherein the electrical coupling between the driver die and the first optoelectronic die comprises a third wirebond electrically coupled between the driver die and the first optoelectronic die.

27. The optocoupler package of claim 25, further comprising a first die attach region electrically coupled to a second lead of the plurality of leads and a second die attach region electrically coupled to third lead of the plurality of leads, and wherein the first and third optoelectronic dies are disposed on the first die attach region at the first and second surfaces of the substrate, respectively, and wherein the second and fourth optoelectronic dies are disposed on the second die attach region at the first and second surfaces of the substrate, respectively.

* * * * *